United States Patent [19]

Shirai et al.

[11] Patent Number: 4,500,899
[45] Date of Patent: Feb. 19, 1985

[54] SEMICONDUCTOR MEMORY DEVICE AND PROCESS FOR PRODUCING THE SAME

[75] Inventors: Kazunari Shirai; Izumi Tanaka, both of Yokohama, Japan

[73] Assignee: Fujitsu Limited, Kawasaki, Japan

[21] Appl. No.: 333,652

[22] Filed: Dec. 23, 1981

[30] Foreign Application Priority Data

Dec. 25, 1980 [JP] Japan .................. 55-184715

[51] Int. Cl.³ .................... H01L 29/78; H01L 27/02; H01L 27/10
[52] U.S. Cl. ........................ 357/23; 357/41; 357/45; 365/185
[58] Field of Search ............. 357/23 VT, 23 CS, 41, 357/42, 49, 88, 23 S, 45; 365/184, 185

[56] References Cited

U.S. PATENT DOCUMENTS

| 3,979,765 | 9/1976 | Brand | 357/23.9 |
| 4,170,500 | 10/1979 | Crossley | 357/23 CS |
| 4,181,537 | 1/1980 | Ichinohe | 357/23 CS |
| 4,264,409 | 4/1981 | Forget et al. | 357/49 |
| 4,368,106 | 1/1983 | Anthony | 204/15 |

OTHER PUBLICATIONS

R. A. Kenyon et al., "Density Improvement in MNOS Array by Overlapping Gate Electrodes", *IBM Technical Disclosure Bulletin*, vol. 18, (1975), pp. 68–69.

Primary Examiner—Andrew J. James
Assistant Examiner—J. Carroll
Attorney, Agent, or Firm—Staas & Halsey

[57] ABSTRACT

The present invention is an improvement of a semiconductor memory device, preferably a PROM or a mask ROM, wherein: MOS transistors are formed in a semiconductor substrate, are arranged in rows, and are isolated from each other by a plurality of field insulation films arranged in an island pattern; the MOS transistors aligned in one of the rows have one common gate which extends over one row of field insulation films; the MOS transistors aligned in one of the rows have a common first region for forming a drain or a source parallel to the common gates; and a second region for forming another drain or source is surrounded by a pair of common gates and a pair of field insulation films so that a plurality of second regions are isolated from each other. According to the present invention, the field insulation films and the common gates are delineated to coincide with one another at the ends thereof facing the common first region using a mask film extending between a pair of common gates and covering the region between the pair of common gates and the part of the common gates not covered by the mask film.

4 Claims, 17 Drawing Figures

SEMICONDUCTOR MEMORY DEVICE AND PROCESS FOR PRODUCING THE SAME

BACKGROUND OF THE INVENTION

The present invention relates to a semiconductor memory device and a process for producing the same. More particularly, the present invention relates to an improvement of a semiconductor memory device in which: MOS transistors are formed in a semiconductor substrate, are arranged in rows, and are isolated from each other by a plurality of field insulation films arranged in an island pattern; the MOS transistors aligned in one of said rows have one common gate which extends over one row of field insulation films; the MOS transistors aligned in one of said rows have a common first region for forming a drain or a source parallel to a plurality of the common gates; and a second region for forming another drain or source is surrounded by a pair of common gates and a pair of field insulation films, so that a plurality of the second regions are isolated from each other.

An example of the semiconductor memory device mentioned above is a programmable ROM (PROM). In the PROM, a number of MOS transistors are arranged in a silicon substrate and have a predetermined arrangement pattern, i.e., they are arranged in row form, as can be seen in a plan view of the PROM of FIG. 1. The gate may be of floating type electrodes, and information, i.e. either electrons or holes, is stored in them by causing an avalanche breakdown of the selected drains of the MOS transistors.

A mask ROM is one of the semiconductor memory devices mentioned above. Instead of the floating type gate, photomasks are utilized to write the information into the selected MOS transistors. In order to write the desired information into the selected MOS transistors by using the photomasks, electrode windows are formed through selected portions of an insulation layer or MOS transistors are selectively formed by means of the photomasks during the production of mask ROMs. In short, in the case of PROMs, the information can be electrically written by the user while in the case of mask ROMs, information can be written by the mask ROM producer with the aid of masks.

The conventional process of production of a PROM with a floating type gate is explained with reference to FIGS. 1 through 3.

In FIGS. 1 through 3, the field insulation films 2 of silicon dioxide are arranged on a P type silicon substrate 1 in an island pattern, as shown in FIG. 1. The drains 6 and sources 7 of the MOS transistors are formed by selectively diffusing N type impurities, such as phosphorus, into the P type silicon substrate 1. The drains 6 are partially exposed through the field insulation films 2 via through-holes 8 formed in the insulation layer, and aluminum conductors 9 (not shown in FIG. 1) are in contact with the drains 6. The gates 30 are formed on a gate oxide film 3 and consist of a polycrystalline silicon floating gate electrode 5, a polycrystalline silicon control gate electrode 5', and a silicon oxide film 4 located between the electrodes 5 and 5'. The polycrystalline silicon control gate electrodes 5' (indicated by the hatching in FIG. 1, upper right) extend laterally in FIG. 1, so that the MOS transistors aligned in either of the rows $R_1$, $R_2$, $R_3$ or $R_4$ have one common polycrystalline silicon control gate electrode 5'. Each common polycrystalline silicon control gate electrode 5' extends over the field insulation films 2 arranged in either of the rows $R_1$, $R_2$, $R_3$ or $R_4$. Each drain 6 is therefore surrounded by a pair of field insulation films 2 and a pair of gates 30, so that a plurality of drains 6 are isolated from each other. On the other hand, the MOS transistors aligned in either of the rows $R_1$, $R_2$, $R_3$ or $R_4$ have one common source 7.

For producing a PROM with floating type gate electrodes, as illustrated in FIGS. 1 through 3, field insulation films 2 are formed quickly on a P type silicon substrate 1 by oxidizing the substrate by means of the selective thermal oxidation method. The island pattern of the field insulation films 2 can be delineated by means of a well-known selective oxidation method. Subsequently, the gate oxide film 3 of each MOS transistor is formed by means of thermal oxidation. Then polycrystalline silicon floating gate electrodes 5 and polycrystalline silicon control gate electrodes 5', respectively, are formed by a chemical vapor deposition (CVD) method and the silicon oxide film 4 of each MOS transistor is formed by means of thermal oxidation. Phosphorus is then introduced into portions of the P type silicon substrate 1 exposed through the field insulation films 2 via apertures (not shown) by means of, for example, a diffusion method. In the formation of the gates 30, photoresist films (not shown) are used for successively delineating the polycrystalline silicon control gate electrodes 5', the silicon oxide films 4, and the polycrystalline silicon floating gate electrodes 5. Thus, the polycrystalline silicon control electrodes 5' extend entirely over the rows $R_1$, $R_2$, $R_3$ and $R_4$ while the polycrystalline silicon floating gate electrodes 5 (indicated by the hatching in FIG. 1, lower left) are located apart from each other in each of the rows $R_1$, $R_2$, $R_3$ and $R_4$. It is desirable from the point of view of producing highly integrated PROMs to decrease the dimensions of the PROM elements shown in FIGS. 1 through 3 and the distance between these elements. However, the distance $l_o$ between the gates 30 and the filed insulation films 2 cannot be decreased to less than approximately 1 micron, which is the smallest dimension or accuracy which can be achieved by means of the photolithographic technique. If the distance $l_o$ is decreased to less than approximately 1 micron, the result is that the electrical properties, for example the mutual conductance $g_m$, of the transistors $Tr_1$ and $Tr_2$ will differ from one another due to an uncontrollable variation of distance $l_o$. If the distance $l_o$ is designed to be less than 1 micron, the width of the polycrystalline silicon floating and control gate electrodes 5 and 5', respectively, on the field insulation films 2 will differ from that of the above-mentioned MOS transistors, especially the width of the central parts 5A of the polycrystalline silicon floating gate electrodes 5 and the polycrystalline silicon control gate electrodes 5', respectively (FIG. 1), due to the fact that the polycrystalline silicon floating gate electrodes 5 and the polycrystalline silicon control gate electrodes 5' are inevitably formed on the slope 2A (FIG. 3) or the inclined position of the field insulation films 2. Furthermore, there is a considerable difference in width between the delineation of the central parts 5A, and the delineation of the polycrystalline silicon floating gate electrodes 5 and the polycrystalline silicon control gate electrodes 5', respectively, to be formed on the slope 2A. The difference in width between the central parts 5A and the other parts of the polycrystalline silicon floating gate electrodes 5 and the polycrystalline silicon control gate electrodes 5' results in a disadvantageous difference between the electrical properties of the MOS transistors $Tr_1$ and $Tr_2$. In order to avoid such a disadvantage, the polycrystalline silicon floating gate electrodes 5 and the polycrystalline silicon control gate electrodes 5', have been conventionally formed on a flat part 2B of the field insulation films 2, as seen in the cross section along the line III—III'. In other words, the end (D) of each field insulation film 2, which faces one source 7 provided in common with the MOS transistors aligned in one of the rows $R_1$, $R_2$, $R_3$ and $R_4$, is disposed apart from the end of the respective common gate 30 and thus does not coincide with it. The distance $l_o$ determined in the light of not only the separation of the end D from the gate 30 but also the photolithographic accuracy can be as great as from 1.5 to 3 microns. Incidentally, the field insulation films 2 have such a function as to electrically isolate a selected MOS transistor(s) from an unselected MOS transistor(s). However, the part of the field insulation films 2 corresponding to the distance $l_o$ does not have a significant influence on the function of field insulation films 2 because a channel-cut layer (not shown) is usually formed beneath the field insulation films 2. Such a part of the field insulation films 2 is not necessary for the performance of PROMs; however, previously it was necessary for carrying out the photolithographic process.

The distances between various elements of PROMs and their dimensions are determined considering the accuracy of the photolithographic technique and the performance of PROMs. For example, the distance between the field insulation films 2 in a direction perpendicular to the gates 30 is usually 3 or 4 microns and is determined mainly in the light of the predetermined resistance of the sources 7 of PROMs.

The mask ROMs have the same disadvantages as do the PROMs when the mask ROMs are provided with gates, sources, drains and field insulations which have a plan geometric view or a plan view similar to that of the PROMs explained hereinabove. The cross-sectional structure of mask ROMs is different from that of PROMs. For example, the gate is not a floating type gate.

SUMMARY OF THE INVENTION

It is an object of the present invention to improve the semiconductor memory device described hereinabove, particularly in regard to a mask ROM and a PROM, thereby enhancing the integration density of their elements and reducing the distance between the adjacent gates extending over the adjacent rows of MOS transistors without inducing a discrepancy in performance among the MOS transistors.

It is another object of the present invention to provide an improved process for producing the semiconductor memory device described hereinabove, thereby reducing the distance $l_o$ between the end (D) of the field insulation films 2 and the end of the gates 30 to zero while removing the limitations due to the accuracy of photolithographic mask alignment.

The present invention is an improvement of a semiconductor memory device, wherein: MOS transistors are formed in a semiconductor substrate, are arranged in rows, and are isolated from each other by a plurality of field insulation films arranged in an island pattern; the MOS transistors aligned in one of the rows have one common gate which extends over one row of the field insulation films; the MOS transistors aligned in one of the rows have a common first region for forming a drain or a source parallel to a plurality of common gates; and a second region for forming another drain or source is surrounded by a pair of common gates and a pair of field insulation films, so that a plurality of the second regions are isolated from each other; furthermore, the field insulation films are arranged in an island pattern, and the field insulation films and the common gate coincide with one another at the ends thereof facing the common first region.

The present invention is also an improvement of a process for producing a semiconductor memory device comprising an array of MOS transistors and is characterized by: forming field insulation films on a semiconductor substrate; selectively forming, on the field insulation films and portions of the semiconductor substrate not covered by the field insulation films, a pair of common gates opposite to one another and extending in rows; selectively forming a mask film extending between said pair of common gates to cover the region between the pair of common gates; removing by etching the exposed field insulation films covered by neither the mask films nor the gates; and subsequently introducing impurities into the semiconductor substrate by using, the remaining field insulation films and gates which function as a mask, thereby forming the sources and drains of the MOS transistors.

DESCRIPTION OF THE PREFERRED EMBODIMENTS

An embodiment of the present invention applied to a PROM is described with reference to FIGS. 4 through 9.

Figure 4:
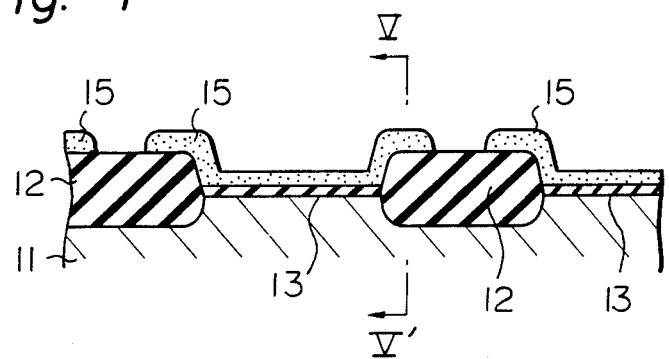
FIGS. 4 through 14 are cross-sectional views of a PROM at intermediate stages of production according to the present invention, the cross-sectional line shown in each drawing indicates the number of the drawing in which the cross-section appears.
Figure 5:
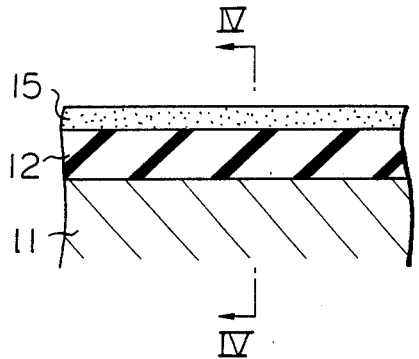
Figure 6:
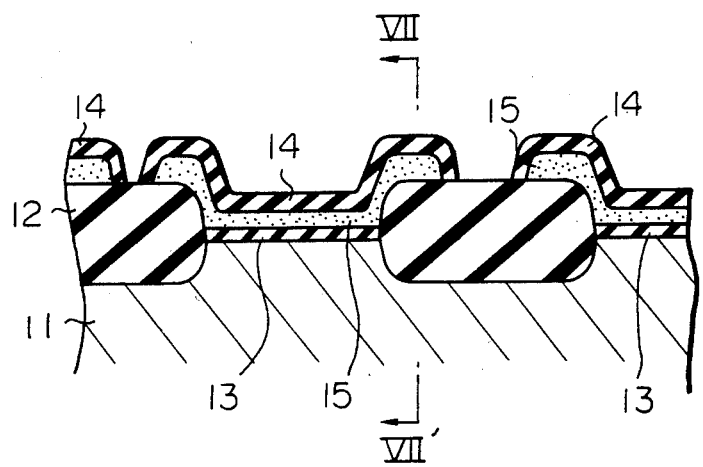
Figure 7:
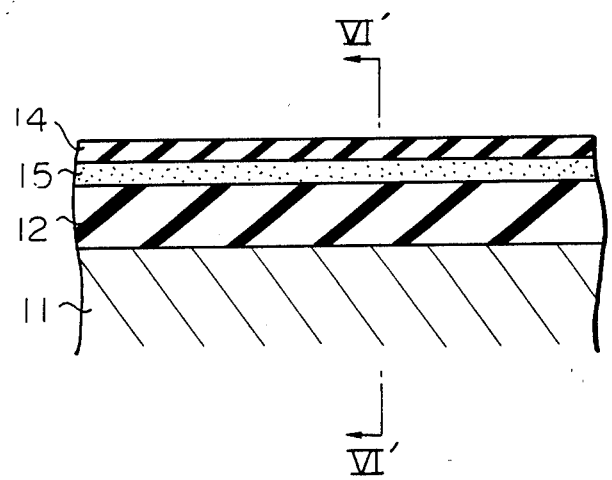
Figure 8:
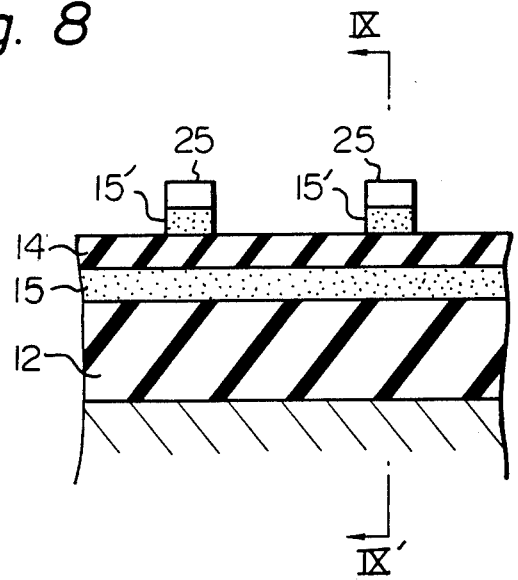
Figure 9:
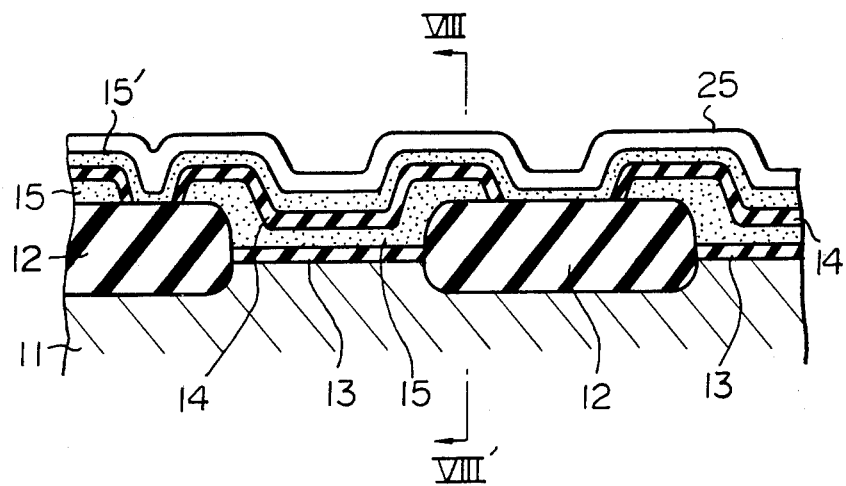
Figure 10:
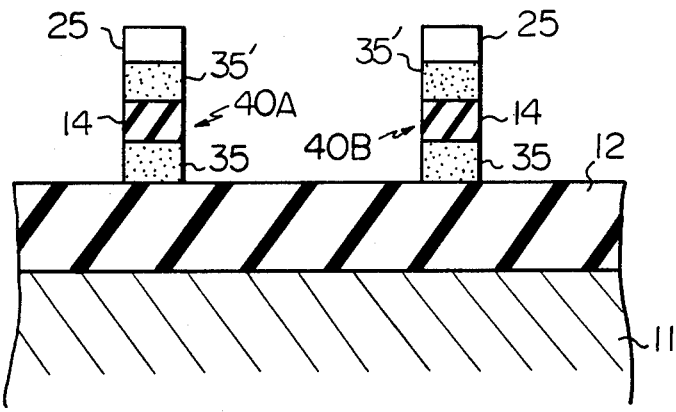

Insulation films 12 of silicon dioxide are formed on a P type silicon substrate 11 by means of selective thermal oxidation, as shown in FIGS. 4 and 5. These insulation films 12 are in strip form (having a strip width of, for example, 3 to 5 microns) and are thick, for example, from 0.5 to 0.8 microns, as can be readily understood from FIG. 4. Although, the insulation films 12 are advantageously in strip form they may be in the form of islands, as in the conventional process, provided that the distance between the adjacent islands in the direction perpendicular to the rows is lessened in the present invention. Gate oxide films 13 (FIG. 4) are then formed, by means of the thermal oxidation method, on the P type silicon substrate 11 not covered by the insulation films 12. Polycrystalline silicon is deposited, by means of the CVD method, entirely above the P type silicon substrate 11 and is then delineated in a strip pattern. The so delineated polycrystalline silicon strips are denoted by the number 15 in both FIGS. 4 and 5. As shown in these figures, polycrystalline silicon strips 15 are separated from one another only in the lateral direction in the drawing of FIG. 4. These polycrystalline silicon strips 15 are formed by applying a photoresist film (not shown) on the polycrystalline silicon layer, light-exposing the photoresist film to form the strip pattern mask, and selectively removing or plasma-etching the polycrystalline silicon by means of the strip pattern mask. The polycrystalline silicon strips 15 are hereinafter referred to as the lower polycrystalline silicon layers 15. Silicon oxide films 14 (FIGS. 6 and 7), which are utilized to insulated the lower layers of the floating type gates and the upper layers of the floating type gates from one another, are formed on the lower polycrystalline silicon layers 15 by means of thermal oxidation. Polycrystalline silicon is deposited on the silicon oxide films 14 (FIGS. 8 and 9) by means of the CVD method and is selectively removed by etching using photoresist masks 25 as an etching mask, thereby forming the upper polycrystalline silicon layers 15' (FIG. 8). The silicon oxide films 14 and then the lower polycrystalline silicon layers 15 (FIG. 8) are successively removed using the photoresist masks 25 as an etching mask. As a result of selective etching using the photoresist masks, a pair of common gates 40A and 40B are delineated in such a manner that they are opposite to one another and extend in the direction indicated by $R_1$, $R_2$, $R_3$, $R_4$ and $R_5$ (FIG. 11).

Figure 11:
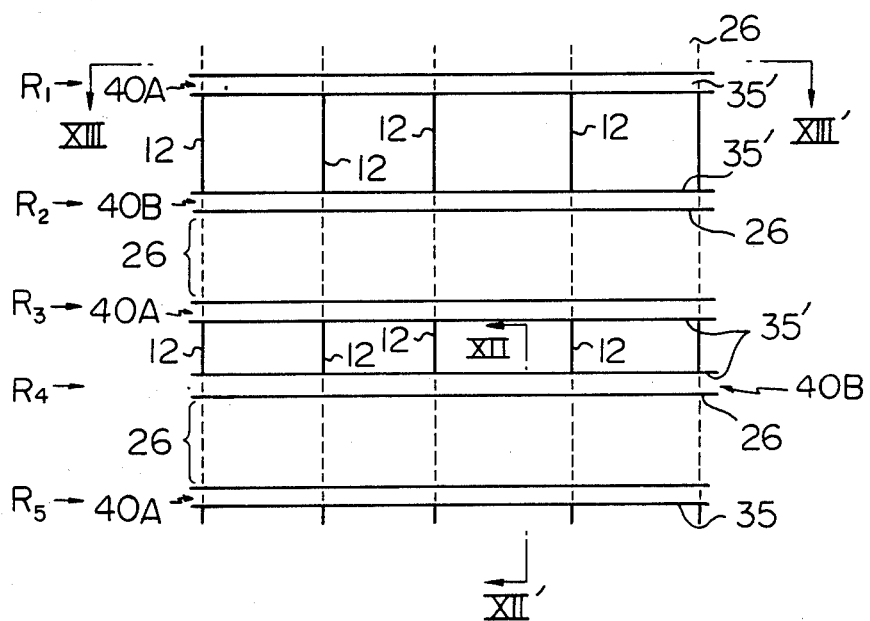
Figure 12:
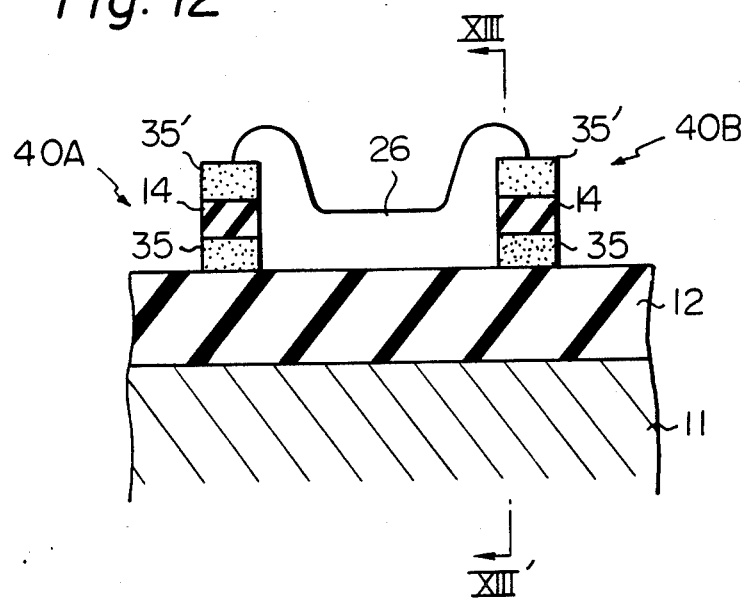
Figure 13:
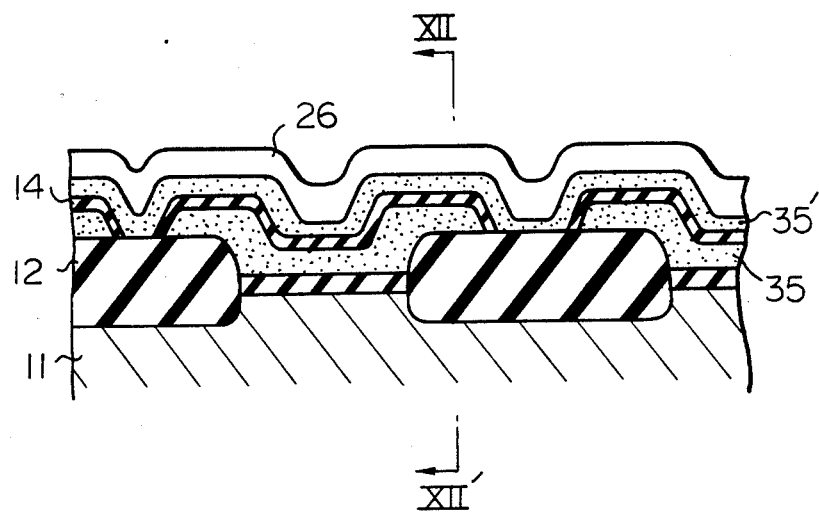

Subsequently, mask films 26, for example photoresist films, are formed as shown in FIGS. 11 through 13, whereby each of the mask films 26 extends between the pair of common gates 40A and 40B. Portions of the insulation films 12, which are covered by neither the mask films 26 nor the common gates 40A and 40B, are selectively removed by etching, preferably by reactive sputter etching. As can be understood from FIG. 11, the pattern of mask films 26 should be of such dimensions and accuracy that the pattern terminates on the polycrystalline silicon control electrodes 35', thereby making it unnecessary for the delineating accuracy of the pattern to be very high.

Figure 1:
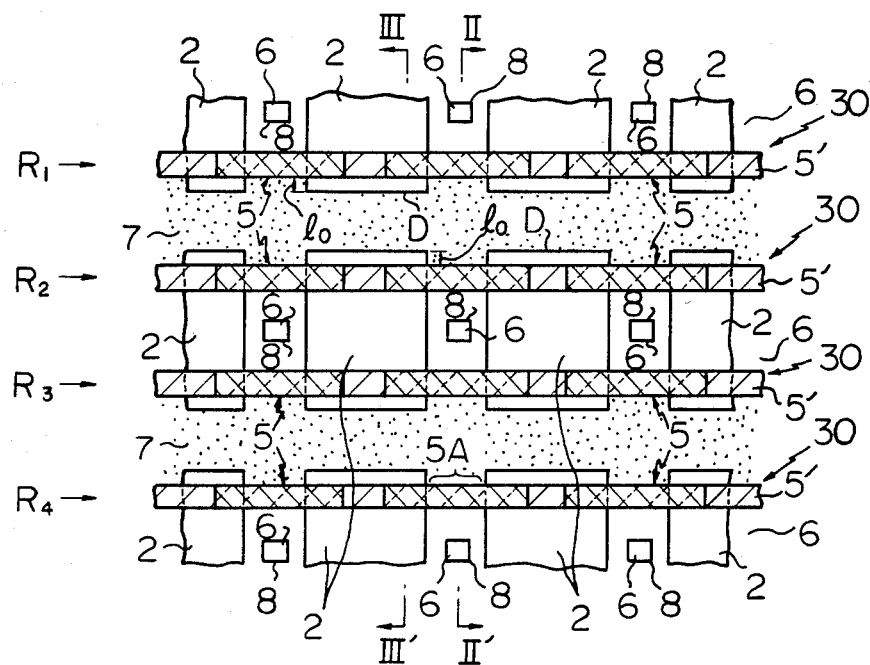
FIG. 1 is a plan view of a memory cell transistor array of a conventional PROM.
Figure 2:
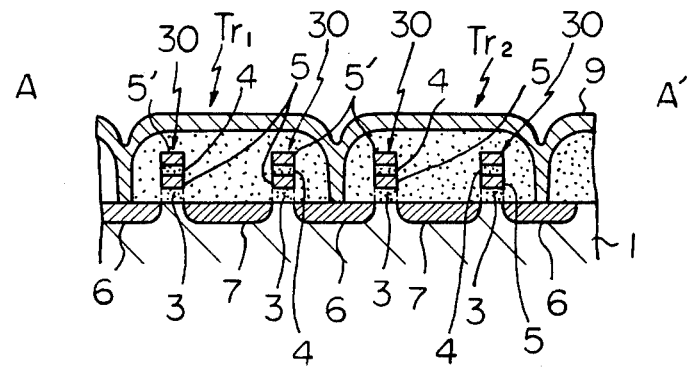
FIGS. 2 and 3 are cross-sectional views along lines II—II' and III—III' of FIG. 1.
Figure 3:
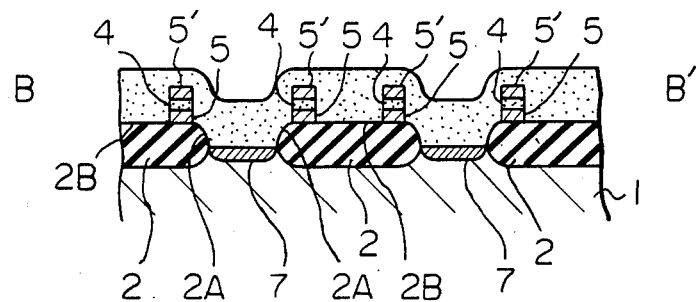
Figure 14:
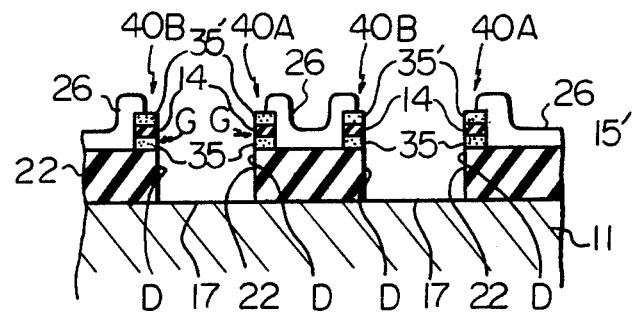
Figure 15:
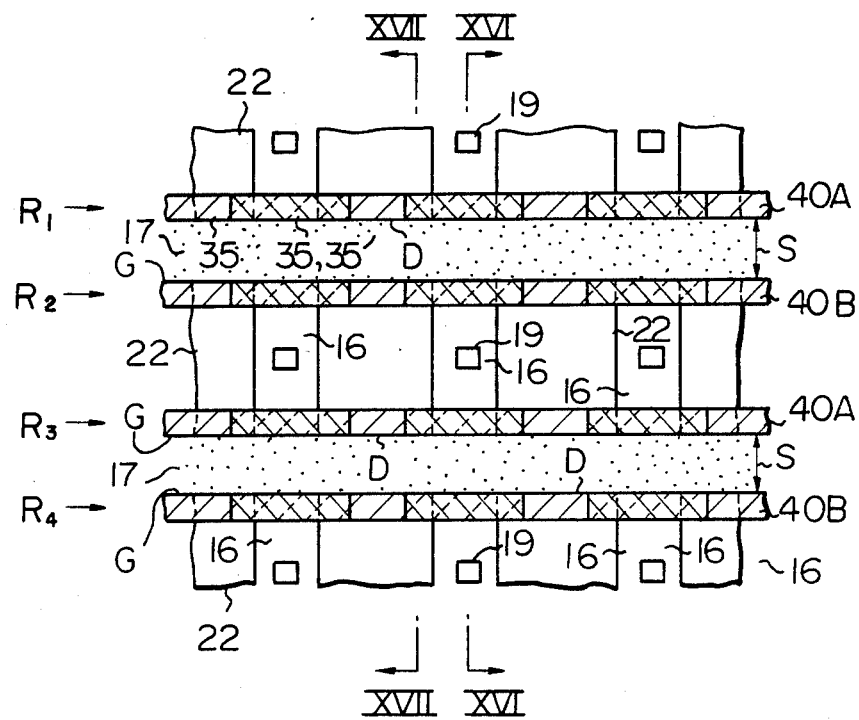
FIG. 15 is a plan view of a PROM according to an embodiment of the present invention.

The P type silicon substrate 11 having layers, films and mask films 26, as shown in FIGS. 11 through 13, is located in a reactive sputter etching apparatus so as to conduct selective etching of the insulation films 12. The gases in this apparatus are evacuated so as to obtain a predetermined degree of vacuum and trifluoromethane (CHF$_3$) gas is introduced into the apparatus. A high frequency voltage of 13.56 MHz is applied to the trifluoromethane gas, thereby subjecting the insulation films 12 comprising silicon dioxide to reactive sputter etching. While the insulation films 12 are being etched, the mask films 26 and the polycrystalline silicon control electrodes 35' are not etched substantially by the reactant gas, i.e. CHF$_3$ gas. As a result of reactive sputter etching, the P type silicon substrate 11 is selectively exposed so that common first regions 17 (FIG. 14) can be formed. In addition, the field insulation films 22 are delineated in an island pattern, as shown in FIG. 15. The end (D) of the field insulation films 22 is delineated in alignment with the end (G) of the common gates 40A and 40B, as seen in FIG. 14. As can be understood from FIGS. 14 and 15, the field insulation films 22 arranged in an island pattern and the common gates 40A and 40B coincide with one another at the ends (D and G) thereof facing the common first regions 17 (dotted parts) where sources of the MOS transistors are formed. The common first regions 17 have no parts corresponding to the distance $l_o$ in FIG. 1, and the width S of the common first regions 17 can be equal to the width of the sources 7, i.e. their width can be equal to the distance between the insulation films. The width S may be designed to be from 2 to 5 microns, while in the conventional device marginal regions having a width of more than 1 micron for providing the distance 1 are required in addition thereto. In other words, since no such distance $l_o$ as that shown in FIG. 1 is formed in the present invention, a higher integration degree than in the case of conventional PROMs is realized by the present invention.

Not only reactive sputter etching but also plasma etching, wet etching, and other methods by which silicon dioxide (SiO$_2$) can be selectively removed can be used to remove the insulating films 12 as described above.

Figure 16:
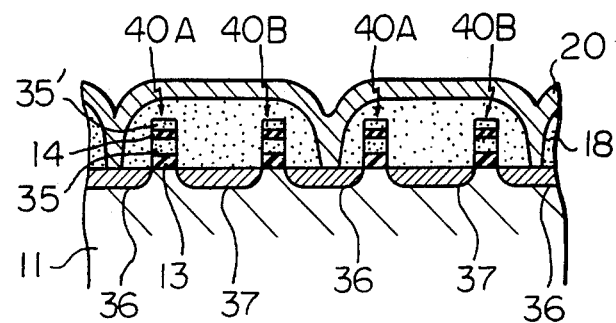
FIGS. 16 and 17 are cross-sectional views along lines XVI and XVII of FIG. 15, respectively.
Figure 17:
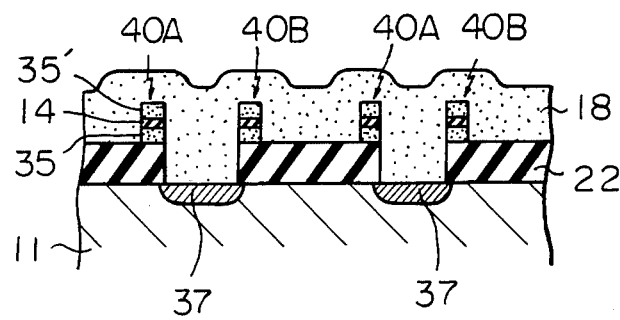

Referring to FIGS. 16 and 17, phosphosilicate glass layers 18 are applied on the P type silicon substrate 11 so as to thermally diffuse phosphorus into the common first regions 17 and into the second regions 16, thus forming sources 37 and drains 36 in the regions 17 and 16, respectively. The introduction of impurities for forming sources 37 and drains 36 may be accomplished by a conventional ion implantation technique instead of thermal diffusion. In either case, the common gates 40A and 40B and the field insulation films 22 function as a mask to block the impurities, thereby defining the sources and drains. Then through-holes 19 are formed through the phosphosilicate glass layers 18 so as to partially expose the drains 36, and aluminum conductors 20 are formed to realize an ohmic contact with the drains 36 via the through-holes 19. The aluminum conductors 20 can be formed by means of the evaporation of aluminum and the photolithographic technique.

We claim:
1. In a semiconductor memory device, comprising:
   a semiconductor substrate;
   MOS transistors for use as memory cells formed in said semiconductor substrate and arranged in a plurality of rows;
   a plurality of field insulation films arranged in an island pattern formed on said semiconductor substrate, aligned in rows, isolating said MOS transistors from each other and each having an end;
   common gates of respective said MOS transistors running in the direction of the rows and said common gates formed on and extending on one row of said field insulation films and having an edge;
   a common first region for forming a source or a drain of said MOS transistors running in the direction of the rows and said common first region being parallel to said common gates; and
   second regions each for forming another source or drain of each MOS transistor, surrounded by both a pair of said common gates and a pair of said field insulation films that are arranged in an island pattern and each of said second regions being isolated from each other; and
   the end of said field insulation films facing said common first region and coinciding with the edge of said common gate extending on said field insulation films and also facing said common first region.

2. A semiconductor memory device according to claim 1, wherein the ends of said field insulation films are delineated by etching using a mask film extending between a pair of common gates and covering the region between the pair of common gates and using the part of the common gates not covered by said mask film.

3. A semiconductor memory device according to claim 1, wherein said common first region is the source of said MOS transistors.

4. A semiconductor memory device according to claim 3, wherein the width of said common first region is from 2 to 5 microns.

* * * * *

UNITED STATES PATENT AND TRADEMARK OFFICE
CERTIFICATE OF CORRECTION

PATENT NO. : 4,500,899

DATED : February 19, 1985

INVENTOR(S) : KAZUNARI SHIRAI ET AL.

It is certified that error appears in the above-identified patent and that said Letters Patent is hereby corrected as shown below:

Col. 2, line 39, "filed" should be --field--.

Signed and Sealed this

Thirteenth Day of August 1985

[SEAL]

Attest:

DONALD J. QUIGG

Attesting Officer     Acting Commissioner of Patents and Trademarks